United States Patent [19]

Kosowsky et al.

[11] Patent Number: 4,987,418

[45] Date of Patent: Jan. 22, 1991

[54] FERROELECTRIC PANEL

[75] Inventors: Lester H. Kosowsky, Stamford; Frederick Kubick, Redding, both of Conn.

[73] Assignee: United Technologies Corporation, Hartford, Conn.

[21] Appl. No.: 138,775

[22] Filed: Dec. 28, 1987

[51] Int. Cl.[5] ........................ H01Q 15/14; H03C 7/00

[52] U.S. Cl. ........................ 342/6

[58] Field of Search ........................ 342/6, 5

[56] References Cited

U.S. PATENT DOCUMENTS

| | | | |
|---|---|---|---|
| 2,840,819 | 6/1958 | McClellan | 342/6 X |
| 3,305,863 | 2/1967 | Jacobs | 342/6 |
| 3,417,398 | 12/1968 | Lewis et al. | 342/6 |
| 3,522,602 | 8/1970 | Planck | 342/6 |
| 3,773,684 | 11/1973 | Marks | 342/6 |
| 3,879,731 | 4/1975 | Mack | 342/5 |
| 3,958,246 | 5/1976 | Wohlers et al. | 343/754 |
| 4,117,485 | 9/1978 | Gorr et al. | 342/6 |
| 4,314,249 | 2/1982 | Onoe | 342/6 |
| 4,347,512 | 8/1982 | Sweeney | 343/911 L |
| 4,419,669 | 12/1983 | Slager et al. | 342/6 |
| 4,660,046 | 4/1987 | Foral | 342/6 X |
| 4,686,150 | 8/1987 | Talley et al. | 342/5 X |
| 4,725,490 | 2/1988 | Goldberg | 342/6 X |
| 4,728,554 | 3/1988 | Goldberg et al. | 342/5 X |
| 4,761,055 | 8/1988 | Hatje | 342/5 X |

FOREIGN PATENT DOCUMENTS

| | | | |
|---|---|---|---|
| 0104506 | 6/1983 | Japan | 343/912 |

*Primary Examiner*—Thomas H. Tarcza
*Assistant Examiner*—John B. Sotomayor

[57] ABSTRACT

An arrangement for modifying impressed radars signals with an internally generated signal to establish a misrepresentative return signal which is confusing as to actual range, size and position.

5 Claims, 2 Drawing Sheets

FERROELECTRIC PANEL

TECHNICAL FIELD

The technical field addressed by the invention herein is that of modifying received radio frequency signals to produce a deceptive return, not completely indicative of the received signal and the typical object monitored, and more particularly that of ferroelectric structures and materials for reflectively modifying impressed radar signals.

BACKGROUND ART

Aircraft, vehicles and other objects operating in hostile territory or airspace are often subject to enemy radar monitoring and illumination.

To prevent them from being correctly identified, positioned and otherwise monitored, it is desirable to confuse the enemy by partially or completely modifying the received or impressed radar signal and to produce a return or echo which is unrepresentative or unrelated in whole or part to the actual nature or character of the illuminated vehicle.

DISCLOSURE OF INVENTION

According to the invention, a voltage tunable ferroelectric medium having surface electrodes is disposed over a predetermined region of an object in the form of a uniformly thick layer of material in contact with a metallic backing. This device modulates the phase of the impressed illuminating signal in a manner dependent on the electric field applied within the medium, thereby producing a return signal which is prone to misinterpretation.

For the preferred version of the invention, the front surface of said ferroelectric layer is covered with a radio-frequency transparent electrically conductive film. This film and the metallic backing form an electrode pair that is electrically driven according to a selected, predetermined modulating voltage scheme.

Further, a dielectric layer having a predetermined thickness and permittivity is applied to the arrangement as an impedance matching transformer, effective for minimizing reflective losses of the illuminating electromagnetic radiation.

Other features and advantages will be apparent from the specification and claims and from the accompanying drawings which illustrate an embodiment of the invention.

BEST MODE FOR CARRYING OUT THE INVENTION

Figure 1:
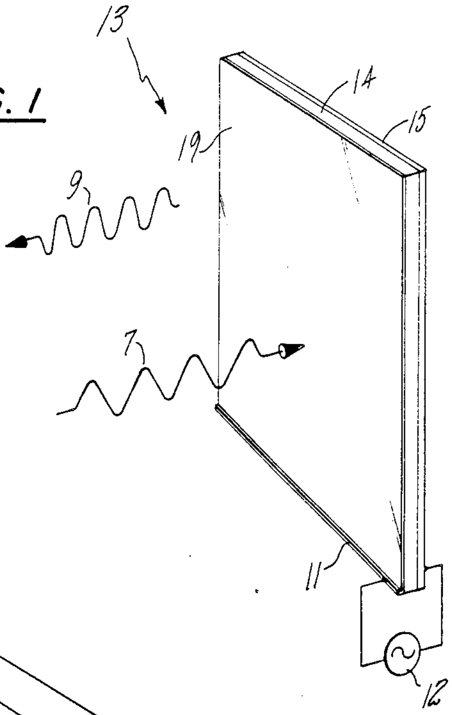
FIG. 1 shows a general scheme in isometric form of a ferroelectric panel, according to the invention herein.

FIG. 1 shows an isometric view of the ferroelectric panel 13 according to the invention herein, the panel 13 being shown driven by an impressed voltage signal V(t), from signal generator 12 which is a function of time "t" and which will be discussed in greater detail below.

The active layer 14 is made of a selected ferroelectric material, such as Barium Titanate, having a dielectric constant that can be changed in a continuous fashion by application of an electric field or voltage. The impressed field may range from the audio up to the radio frequency range, according to the invention herein.

Figure 2:
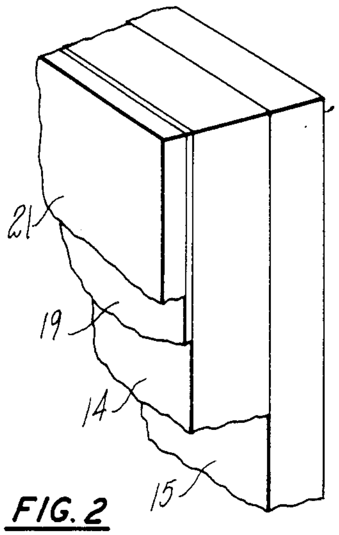
FIG. 2 is a detail of a portion of the ferroelectric panel particularly disclosing the layered construction of the preferred version of the invention.

The device configuration of panel 13 can be adapted for use in waveguide structures, or for use as a large aperture panel having a relatively thin structural profile. According to the preferred version of the invention illustrated in FIG. 2, panel 13 is disposed over a selected relatively large area. As shown in FIG. 2, the panel 13 further comprises a uniformly thick ferroelectric active layer 14 in contact with a metallic surface 15 that acts to reflect the radiation. The front surface of the ferroelectric layer 14 is covered with an RF transparent conductive layer 19 that forms, together with the metal backing 15, the surface electrode structure across which modulating voltage V(t) is applied.

Since ferroelectrics generally have very high dielectric constants, a second dielectric layer 21 having the proper thickness and permittivity effectively to act as an impedance matching transformer is preferred, thereby enabling the incident RF radiation, denoted by arrow 7, to be coupled into the active medium 14 subject to a minimum of reflective loss. This second layer 21 is preferably place in front of electrode 19, as shown in FIG. 2. In some applications, however, the signal from the panel may be strong enough so that reflections can be tolerated and the matching layer can be dispensed with as shown in FIG. 1. The RF signal that couples into the active medium is reflected by the rear backing 15 and emerges from the panel 13 (arrow 9) subject to a net phase shift.

The value of this phase shift depends on the electric field "E" existing in the active medium 14 as follows: $\phi = 4\pi h\sqrt{K(E)}/\lambda + \phi_0$, where K(E) is the electric field dependent permittivity of the ferroelectric material, $\lambda$ is the free space RF wavelength, "h" is the thickness of the active layer 14, and $\phi_0$ is a constant representing the phase shift contribution from the other nonactive dielectric layer 21.

In operation, a voltage waveform V(t) will be applied to the surface electrodes bracketing panel 13 when illuminating radar radiation is present. The effect of the voltage V(t) is to modulate the electric field inside the ferroelectric medium, thereby creating a modulation of the phase shift $\phi$ of the reflected RF signal. The waveform may be selected from a number of stored waveforms to cause the reflected signal to appear as treetop clutter or any other desired signal. The waveform may also depend on the wavelength of the interrogating radar, if desired.

Detection of interrogating radar is well known in the art and is omitted from this description for simplicity.

The permittivity K(E) of the ferroelectric medium is typically considered to be a complex, frequency dependent variable. Accordingly, the RF signal passing through medium 14 will suffer a net absorption loss, and the phase shift will vary over the operating frequency range in which the arrangement is employed. For the preferred embodiment reasonable results may be obtained within a 30% bandwidth, i.e., 10 GHz±3 GHz.

Figure 3:
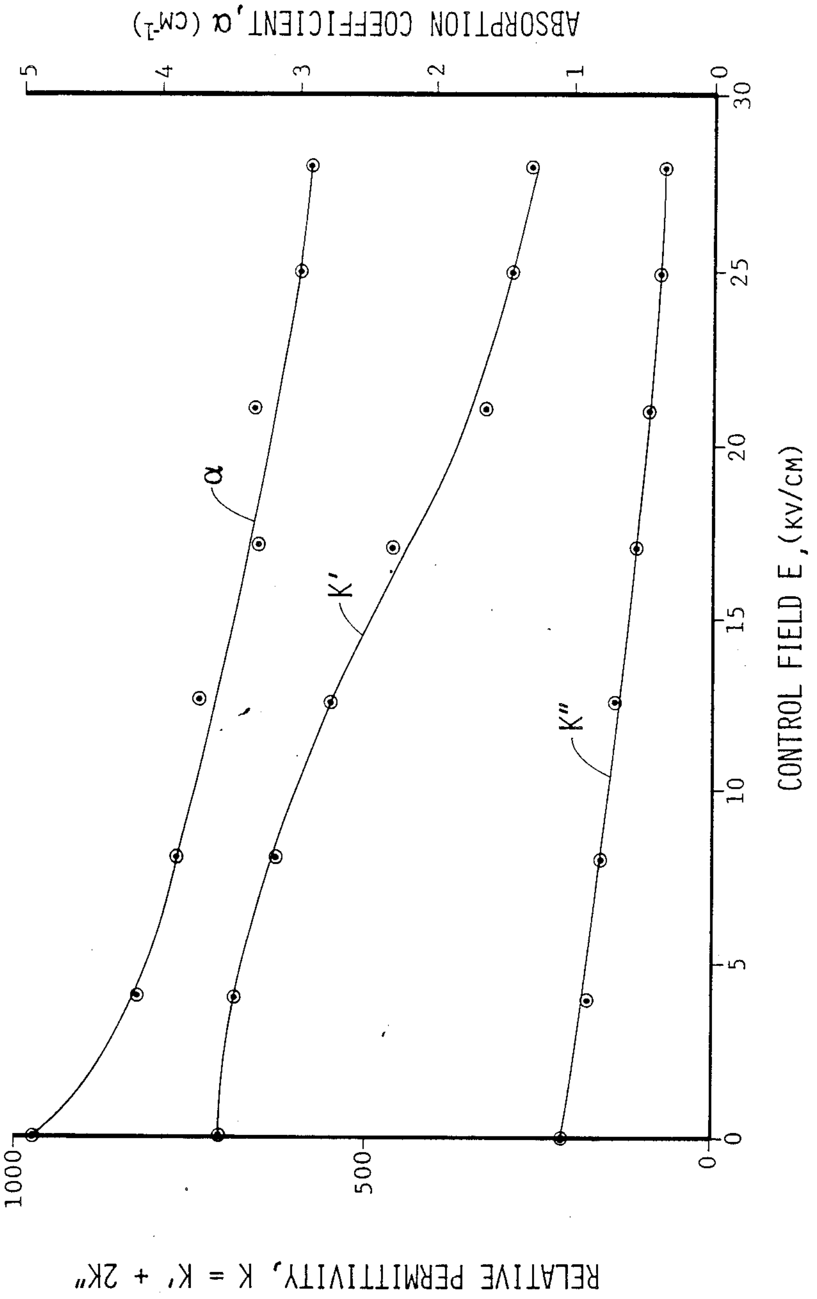
FIG. 3 shows the dependence of relative permittivity with applied field for a preferred material.

A suitable material for active layer 14 is ceramic barium titanate, ($BaTiO_3$) which for a typical formulation, has a relative permittivity of about 500. Data taken at 3 GHz and illustrating the variation in K(E) for barium titanate, as the electric field "E" ranges from zero to nearly 30 kV/cm are shown in FIG. 3. The real and imaginary parts of K in FIG. 3 are plotted separately as K' and K" respectively. The behavior in the 10 GHz region is generally similar to that at 3 GHz except for a scaling down of permittivity values by a factor of about two. For the sake of illustration, the performance capabilities of a Doppler panel operating at 10 GHz will be estimated from the permittivity characteristic established in FIG. 3, bearing in mind that other ferroelectric materials, may ultimately prove to have superior properties at 10 GHz. A suitable impedance matching material for layer 21 will have a relative permittivity that is approximately the square root of the relative permittivity of the active layer and should have a thickness corresponding to a quarter wavelength. In the case of Barium Titanate, a suitable material for layer 21 is ceramic magnesium calcium titanate, a familiar microwave dielectric that can have permittivity in the range between 10 and 150, depending on the composition.

RF-transparent electrode 19 may be an thin film coating of any convenient metal or metal oxide, such as gold, nichrome, tantalum, or platinum indium-tin oxide. It should be in intimate contact with the active material 14, which can be achieved by vacuum deposition or chemical deposition. Edge strip 11 along the bottom edge of RF-transparent electrode 19 in FIG. 1 might be used to distribute the current flow along that edge, so that the danger of damage to the thin electrode is reduced. Electrode 15 may be any convenient thickness and must also be in intimate contact with material 14.

The detailed design of panel 13 will be determined by tradeoffs between desired phase shift variation, control field, RF absorption loss and modulation driver requirements. It should be observed that the control field E, (E=V(t)/h, where "h" is the thickness of the active layer) is limited by the dielectric breakdown characteristic of the ferroelectric material and should generally not exceed 30 kV/cm. Further, h should be selected to minimize voltage drive requirements consistent with the required phase shift modulation. The modulation driver will couple to a capacitive load, defined by the area of the panel, and the design of the RF transparent electrode 19 must take into account large surface currents.

The variation of relative permittivity K with field E is independent of field orientation in an unpoled ferroelectric medium 14 such as Barium Titanate, so that K will decrease as the absolute magnitude of E increases. This results in a nonlinear transfer characteristic, which must be taken into account in system design. The response may be made more linear by selecting an operating point on the permittivity characteristic that is in a more linear range. If it is assumed that the square-root of the relative permittivity, i.e., $\sqrt{K(E)}$, also known as the refractive index n(E), varies linearly with the control field E according to rate (slope) "S", then the phase variation caused by the voltage modulation V(t) follows the relationship: $\Delta\phi(t)=4\pi SV(t)/\lambda$.

If the active medium is lossy, then K(E) and n(E) are complex quantities. The real and imaginary parts of K(E) for a typical Barium Titanate composition are plotted as functions of the field E in FIG. 3. The computation of complex n(E) requires knowledge of both the real and imaginary parts of K(E). The phase shift $\Delta\phi(t)$ is determined by the real part of n(E). The imaginary part of n(E) is determines the RF absorption loss coefficient $\alpha(E)$, also plotted in FIG. 3. The RF absorption loss "A" is simply defined as $A=e^{-2h\alpha(E)}$. Further, "A" is the only RF loss quantity present, if reflection prior to the active layer is eliminated by effective impedance matching.

If the rate S is computed from FIG. 3, it follows that: $\Delta\phi(t)=-5\times10^{-4}$ radians/volt) V(t), where the minus sign appears because phase shift decreases with applied field E(t).

The indicated phase modulation is intended to alter the spectral characteristics of an intercepted RF signal in a manner designed to confuse or deceive enemy radar. If, for example, it is desired to impress a spectral spread on a received 3 GHz radar signal to simulate tree top clutter, the instantaneous frequency change of the RF carrier will depend on the time derivative of $\Delta\phi(t)$ which in this example is proportional to the time derivative of V(t). The Doppler spread caused by the motion of tree branches having an RMS speed of about 2 m/sec is +40 Hz. Signal generator 12, in this case, will generate noise within some bandwidth to produce the desired spread. The time derivative of V(t) has a maximum value given roughly by the product of its amplitude $V_0$ with its highest frequency component "$f_m$" times $2\pi$.

Using the relationship above to connect the phase shift to the signal from generator 12. We have:

$$\text{Doppler spread} = 40\text{ hz} = \frac{1}{2\pi}\frac{d\Delta\phi}{dt} = \frac{1}{2\pi}\,5\times10^{-4}\,\frac{\text{radian}}{\text{volt}}\,\frac{dv}{dt} = 5\times10^{-4}\,V_0\cdot f_m$$

If $f_m$ is selected to be 10,000 Hz as a compromise between the requirements of tolerable reactive loading of the driver circuit and low power consumption, the corresponding voltage that signal generator 12 will have to produce at 10 KHz will be 8 volts. Those skilled in the art will readily be able to calculate other sets of parameters to satisfy other systems requirements.

Assume further that the active layer thickness "h" is set so that 16 volts between the panel electrodes translates to a control field variation of 160 V/cm. Added to this, of course, is the zero point control field needed to establish a favorable operating point somewhere on the permittivity characteristic. The active layer thickness then works out to only 1 mm, which corresponds to to an RF absorption loss of about 2 dB, using a worst case coefficient alpha of 5 $cm^{-1}$. The capacitive load presented to the modulation driver, corresponding to a panel area of one square meter, is 6.2/microfarads, suggesting a driver power of about 100 watts.

Other materials, such as ceramic Z5U, a mixture of Barium Titanate and Calcium Zirconate, may respond with a higher degree of phase shift per volt for incident RF radiation that is perpendicular to the applied field, as is the case for the preferred embodiment of FIG. 1.

Figure 4:
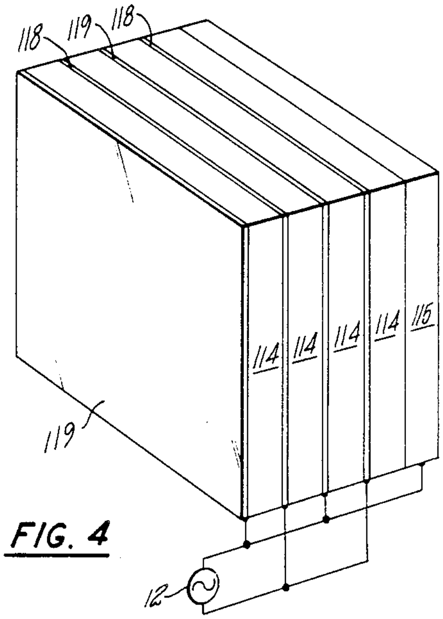
FIG. 4 shows an alternate embodiment of the invention.

FIG. 4 illustrates an alternate version of panel 13 that would substantially reduce the required signal voltage V(t) by distributing electrode surfaces of opposite polarity within the active ferroelectric layer thereby reducing the gap between electrode pairs. RF transparent electrodes 118 and 119 apply a voltage across ferroelectric layer strips 114 to produce the phase shift and electrode 115 reflects the radiation as did electrode 15. These additional RF transparent electrodes increase internal RF dissipation, rendering the panel more absorptive than the preferred embodiment.

Further, if a corner reflector configuration is used to enhance the radar cross section of the phase modulator, at the same time overwhelming the residual radar cross section of the vehicle or structure intended to be disguised, the active area need only be a fraction of a square meter and the power consumption may be further reduced.

The embodiment of FIG. 1 was drawn as a flat panel for simplicity, but panel 13 may be curved to conform to the contour of an aircraft.

It should be understood that the invention is not limited to the particular embodiments shown and described herein, but that various changes and modifications may be made without departing from the spirit and scope of this novel concept as defined by the following claims.

We claim:

1. A device for altering a reflected return signal responsive to external illuminating RF radiation comprising;

a ferroelectric layer of material of substantially uniform composition having a first surface disposed to intercept said illuminating radiation, whereby said illuminating radiation enters said first surface of said ferroelectric layer;

means for impressing an electric field having a predetermined magnitude within said ferroelectric layer, whereby said illuminating radiation undergoes a phase shift dependent on said magnitude of said electric field;

solid reflective means disposed in proximity to a second surface of said ferroelectric layer opposite to said first surface, for reflecting illuminating radiation emerging therefrom back into said second surface, whereby said reflected return signal emerges from said surface in a form dependent upon said illuminating radiation but modified with respect thereto by said phase shift dependent on said electric field.

2. A device according to claim 1, in which said means for impressing an electric field includes generating means for generating a predetermined electrical modulating signal;

a film of conductive material, having a predetermined thickness permitting the passage of electromagnetic radiation therethrough, disposed on said first surface as a first rf-transparent electrode connected to said generating means; and a second electrode disposed in proximity to said second surface and connected to said generating means.

3. A device according to claim 2, in which said reflective means is connected to said generating means and functions as said second electrode.

4. A device according to claim 3, in which at least one impedance-matching layer of predetermined dielectric constant is disposed in proximity to said first electrode for reducing reflections of said illuminating radiation from said ferroelectric material.

5. A device according to claim 2, in which said generating means generates a signal having frequencies in a predetermined bandwidth.

* * * * *